United States Patent [19]

Kurtz et al.

[11] Patent Number: 4,476,365
[45] Date of Patent: Oct. 9, 1984

[54] COVER GAS CONTROL OF BONDING BALL FORMATION

[75] Inventors: John A. Kurtz, Gorham; Donald E. Cousens, Saco, both of Me.

[73] Assignee: Fairchild Camera & Instrument Corp., Mountain View, Calif.

[21] Appl. No.: 433,448

[22] Filed: Oct. 8, 1982

[51] Int. Cl.³ ............................................. B23K 31/00
[52] U.S. Cl. .............................. 219/56.22; 219/56.21; 219/74
[58] Field of Search ............. 219/56.21, 56.22, 137 R, 219/74, 75

[56] References Cited

U.S. PATENT DOCUMENTS

| | | | |
|---|---|---|---|
| 2,497,631 | 2/1950 | Rothschild | 219/74 |
| 2,522,482 | 9/1950 | Olzak | 219/74 |
| 2,905,805 | 9/1959 | McElrath et al. | 219/74 |
| 4,323,759 | 4/1982 | Edson et al. | 219/56.22 |

*Primary Examiner*—C. C. Shaw

*Attorney, Agent, or Firm*—Kenneth Olsen; Carl L. Silverman; Daniel H. Kane, Jr.

[57] ABSTRACT

A method and apparatus is disclosed for forming a ball at the end of bonding wire or lead wire held in a capillary wire holding and bonding tool for ball bonding of the lead wire to an integrated circuit chip. The method of ball formation is of the type in which the end of the bonding wire is enclosed in a shroud or shield and the shield and the end of the bonding wire are flooded with an inert cover gas. Ball formation is accomplished by electrically discharging an arc between the bonding wire and the shroud for melting and forming the ball at the end of the wire. A passageway is provided for delivering and mixing hydrogen gas into the inert cover gas delivery line at a location upstream from the shroud sufficient for complete mixing. The rate of flow of hydrogen gas is metered and controlled for adjusting the percent by volume of hydrogen in the cover gas mixture to a desired range.

16 Claims, 8 Drawing Figures

COVER GAS CONTROL OF BONDING BALL FORMATION

CROSS REFERENCE TO RELATED APPLICATIONS

The present patent application is related to U.S. patent application Ser. No. 262,595, filed May 11, 1981, for "Bonding Wire Ball Forming Method and Apparatus", now U.S. Pat. No. 4,390,771 issued June 28, 1983, and U.S. patent application Ser. No. 294,411, filed Aug. 19, 1981, for "Lead Frame Wire Bonding by Preheating", both applications assigned to the assignee of the present invention.

TECHNICAL FIELD

This invention relates to a new method and apparatus for controlling formation of a ball at the end of bonding wire or lead wire generally held by a capillary wire bonding tool. Such ball formation has particular application for ball bonding of a lead wire to the die pad of an integrated circuit chip. In particular, the present invention relates to control of the quality, size and shape of the bonding ball during ball formation by controlled delivery of a reactive cover gas.

BACKGROUND ART

Bonding of lead wires to a microcircuit chip mounted on a lead frame for coupling to external circuitry is generally accomplished by ball bonding. According to this technique, a lead wire or bonding wire is held in a capillary tool so that the lead wire projects beyond the end of the tool. The capillary tool forms part of a ball bonding machine in which the tool is appropriately mounted and positioned over the metalized die pad of an integrated circuit chip. A ball is formed at the end of the lead wire or bonding wire by, for example, arc discharge between the bonding wire and another electrode. After solidification, the metal ball at the end of the lead wire is brought into intimate contact with the metalized die pad and a bond is formed typically by thermocompression ultrasonic bonding.

Prior art methods of ball formation for bonding lead wires generally suffer from lack of control over the ball formation process with consequent variation in the size, shape, and oxidation of the bonding ball. Further disadvantages of prior art ball bonding machines and methods are discussed in the "Background Art" section of U.S. Pat. No. 4,390,771.

According to the improved apparatus and method for bonding wire ball formation disclosed in U.S. Pat. No. 4,390,771, a ball is formed at the end of bonding wire extending from a capillary tool by substantially enclosing the end of the bonding wire in a shroud or shield, flooding the shroud or shield and the end of the bonding wire with an inert gas, and generating a controlled electrical arc discharge between the lead wire and the shroud or shield which function as complementary electrodes. The method according to U.S. Pat. No. 262,595 permits concise control and metering the energy for melting and forming a ball of uniform quality. In particular, according to the method disclosed, a controlled pulse train of electrical pulses is generated and delivered for arc discharge between the wire and shroud so that the quantity of energy delivered by the pulse train may precisely match the energy requirements for melting a ball of desired dimensions.

OBJECT OF THE INVENTION

It is an object of the present invention to provide even further control over the ball formation process for providing bonding balls of uniform size, shape, and quality.

Another object of the invention is to provide even greater protection from oxidation and in fact to eliminate oxidation of the metal which is melted at the end of the lead wire to form a ball.

A further object of the invention is to provide a new method for controlling the size and shape of a bonding ball in addition to and supplementing the methods described in the U.S. Ser. No. 262,595.

DISCLOSURE OF THE INVENTION

In order to accomplish these results, the present invention contemplates a method for forming a ball at the end of bonding wire or lead wire in the presence of an inert cover gas with the improved step of mixing hydrogen with the cover gas. More specifically, the method of ball formation according to the present invention includes the steps set forth in U.S. Pat. No. 4,390,771 of substantially enclosing the end of the bonding wire in a shroud or shield, flooding the shroud or shield and the end of the bonding wire with an inert cover gas, and discharging a controlled electrical arc between the bonding wire and the shroud for melting and forming the ball at the end of the wire. The present invention, however, contemplates the improved steps of generating a flow of inert cover gas to the shroud or shield, generating a flow of hydrogen gas separate from the inert cover gas and mixing the flow of hydrogen gas with the flow of inert cover gas at a location upstream from the shield or shroud a sufficient distance to permit substantially complete mixing of the hydrogen and inert cover gas upon reaching the shield or shroud.

According to another aspect of the invention the percent by volume of hydrogen comprising the cover gas mixture is controlled at a safe level but within a range which substantially eliminates oxidation during the ball forming process. Over the broadest range the volume of hydrogen in the cover gas mixture is within a range of greater than 0% e.g. 0.5% to less than 25%. In the preferred range for electrical arc discharge within the voltage and amperage ranges disclosed in U.S. Pat. No. 4,390,771, the percent by volume of hydrogen in the cover gas mixture is controlled within the limits of approximately 7% to 10%.

The invention contemplates a new method of controlling the size and shape of the bonding ball by controlling the percent by volume of hydrogen in the cover gas mixture. Typically, argon is used for the inert cover gas though any of the relatively nonreactive gases such as argon, helium, xenon, nitrogen, and other noble gases may be used. With argon as the inert cover gas the percent by volume of hydrogen admixed in the cover gas permits substantial control over the characteristic thermal conductivity of the cover gas. A feature and advantage of the present invention is that hydrogen exhibits a thermal conductivity over ten times greater than argon. As a result, with increasing hydrogen concentration in the cover gas, the thermal conductivity increases drawing applied heat energy away from the ball formation zone.

At concentrations of hydrogen in the preferred range of, for example, 7% to 10% by volume, oxidation of the metal comprising the ball is substantially eliminated by the hydrogen resulting in clean spherical shaped surfaces. With increasing concentration of the hydrogen gas, however, heat is conducted away faster than it can be delivered to the ball forming at the end of the lead wire. As a result clean balls of increasingly smaller diameter are formed. At even higher concentrations, for example, in the range of 18% by volume, a smaller oval shaped ball is formed. Finally, at concentrations of 25% by volume ball formation is attenuated at the electrical power levels used in the ball formation process, for example, as described in U.S. Pat. No. 4,390,771.

According to the apparatus of the present invention for forming a ball at the end of bonding wire a shroud or shield is provided for substantially enclosing the end of the bonding wire. A cover gas source and delivery channel floods the shroud or shield and the end of the bonding wire with the inert cover gas. In the improved apparatus a source and passageway are provided for delivering and mixing hydrogen gas into the inert gas at a location upstream from the shroud a sufficient distance to permit substantially complete mixing with the cover gas. Flow meters are provided for controlling the rate of flow of hydrogen gas into the cover gas thereby controlling the percent by volume of hydrogen in the cover gas mixture within the desired range.

A feature and advantage of the admixture of hydrogen into the cover gas according to the present invention is that the hydrogen strongly reduces oxide, particularly oxides of copper, which may form during ball formation. The hydrogen combines with any oxygen in the cover gas, deoxygenating the cover gas mixture in addition to cleaning the surface of the metal ball. Additionally, the high thermal conductivity of the hydrogen relative to, for example, argon, permits small amounts to be used to adjust the thermal conductivity of the cover gas mixture as a whole thereby controlling the energy delivery to the ball and the size and shape of the ball.

Thus, according to the method of the present invention ball size and shape may be controlled with constant delivery of electrical energy by controlling and adjusting the thermal conductivity of the cover gas surrounding the ball. This is accomplished by varying the percentage or ratio of hydrogen gas by volume in the cover gas with electronic or electrical parameters constant. The electrical energy may be delivered in the form of a controlled pulse train of electrical pulses as described in U.S. Pat. No. 4,390,771 or in the form of a single pulse of controlled duration. The voltages and power levels contemplated by the present invention are, for example, those described in U.S. Pat. No. 4,390,771 where the arc is formed by electrical pulses at 600 volts at a small current derived from capacitors which never discharge more than a few percent of the stored charge.

DESCRIPTION OF PREFERRED EXAMPLE EMBODIMENTS AND BEST MODE OF INVENTION

Figure 1:
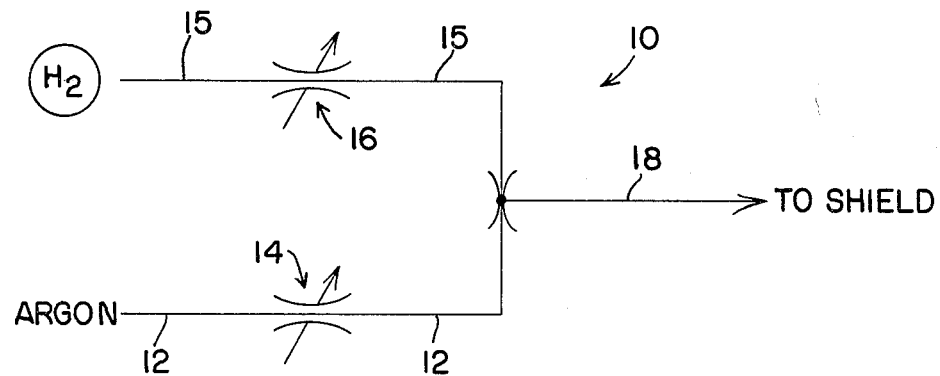
FIG. 1 is a diagrammatic view of a controlled gas mixing apparatus for controlling the cover gas mixture according to the present invention.

An apparatus for delivering a cover gas mixture in accordance with the present invention to a ball bonding machine such as the Kulicke & Soffa Industries, Inc. (K&S) Model 478 or a retrofitted ball bonding machine of the type described in U.S. Pat. No. 4,390,771 is illustrated in FIG. 1. The cover gas mixture source 10 includes a conventional argon gas tank and regulator, not shown, for delivering argon gas along line 12 and through the argon flow meter 14. A conventional hydrogen gas tank and regulator, not shown, delivers hydrogen gas along line 15 through hydrogen flow meter 16. The flow meters 14 and 16 are small variable area type flow meters with fine flow control and direct reading scale such as the Brooks-Mite Flow Indicators manufactured by Brooks Instrument Division of Emerson Electric Company, Hatfield, Pa. 19440.

The gas lines 12 and 15 merge into common cover gas mixture delivery line 18 downstream from the flow meters 14 and 16. Line 18 delivers cover gas to the so called "flame-off shield" of the type illustrated in FIGS. 2 and 3 as hereafter described. The hydrogen metered through line 15 is mixed with the argon or other relatively inert cover gas in line 18 at a distance upstream from the flame-off shield sufficient to permit substantially complete mixing of hydrogen gas with the inert cover gas. In the typical ball bonding machine, the delivery line 18 may be, for example, two to three feet (0.6 to 1 meter) in length. Line 18 is typically flexible hose connected to the flame-off shield permitting movement of the shield between retracted and extended positions.

Figure 2:
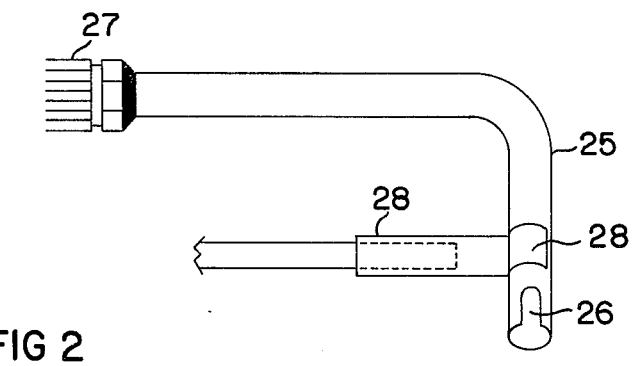
FIG. 2 is a shield or shroud for delivering the cover gas mixture to the end of the lead wire or bonding wire.
Figure 3A:
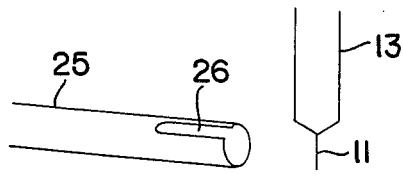
FIG. 3A is a perspective detail of the end of the shroud and lead wire prior to enclosing the end of the lead wire in the shroud.
Figure 3B:
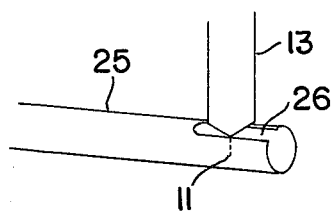
FIG. 3B is a perspective detailed diagram of the shroud enclosing the end of the lead wire in preparation for ball formation.

A tubular shroud or shield 25 suitable for enclosing the end of the capillary tool and bonding wire of a stock bonding machine is shown in FIGS. 2 and 3. The shroud 25 is formed, for example, from a tube 3 mm to 4 mm in diameter of stainless steel or other conducting material. The end of the tubular shroud is formed with a notch 26, 1½ mm to 2 mm wide, and 6 mm to 7 mm long. In any event, the notch is appropriately dimensioned for receiving and substantially enclosing the tip of capillary tool 13 and the end of the bonding wire 11 as shown in FIG. 3B.

The tubular shroud 25 provides a conduit for delivering the cover gas mixture such as argon and hydrogen as heretofore described and is connected to an appropriate fitting 27 for coupling to flexible hose line 18. Near the end of the shroud 25 and adjacent the notch 26 an electrode 28 is electrically connected to the shroud so that the shroud forms a complementary electrode with the end of the bonding wire 11. The electrode can be constructed so that at the joint with the shroud a tungsten spot or area on the inside of the shroud provides a preferred site for arc discharge between the end of the bonding wire 11 and the electrode 28.

Further description of the apparatus for performing the flame-off cycle using controlled arc discharge is found in said U.S. Pat. No. 4,390,771 which is incorporated herein by reference.

According to the invention the percent by volume of hydrogen in the cover gas mixture may be controlled and varied by flow meter 16 to achieve the optimum mixture in a particular application. In using flow meters of the type described by way of example above, the direct reading from the flow meter scale in standard cubic feet per hour (SCFH) must be converted to the actual flow rate using a different conversion factor for each gas. Because of the different characteristics of hydrogen and argon, a conversion multiple of 3.8 is applicable for hydrogen and a conversion factor of 0.849 is applicable for argon using the Brooks-Mite Flow Meters referred to above. A summary of the different percentage hydrogen by volume achieved in the cover gas mixture using different flow rates for the argon and hydrogen are summarized in Table I. In the 4 examples summarized, the percent by volume of hydrogen in the cover gas mixture is 0%, 10%, 18%, and 25%. The results of ball formation during the flame-off cycle using the ball bonding apparatus and method, for example, described in U.S. Pat. No. 4,390,771 and with the reactive cover gas at the percentages above are also summarized in Table I and illustrated in FIGS. 4A through 4D.

Figure 4A:
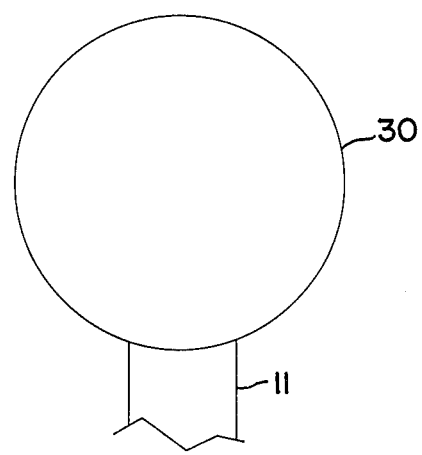
FIG. 4A is a plan view from the side of a bonding ball formed in accordance with the method of U.S. Pat. No. 4,390,771 using an inert cover gas.
Figure 4B:
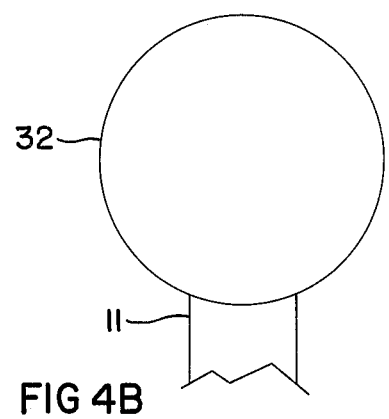
FIG. 4B is a side plan view of a smaller bonding ball formed in accordance with the method of the present invention using a reactive cover gas mixture including hydrogen in the preferred range percentage by volume of 7% to 10%.

FIG. 4A illustrates a bonding ball 30 formed at the end of the lead wire using a pure argon cover gas without admixture of hydrogen in accordance with the present invention. It is understood, of course, that other inert or relatively non-reactive gases may be used. The ball bonding lead wire is typically 0.001" in diameter and the illustrated bonding ball is achieved using the method described in U.S. Pat. No. 4,390,771. With an admixture of hydrogen in the cover gas mixture is the amount of 7% to 10% by volume and in this example 10% by volume, the bonding ball 32 illustrated in FIG. 4B results using the same method. With the admixture of hydrogen at the rate of 10% by volume with the inert cover gas, a smaller bonding ball results because of the high thermal conductivity of hydrogen. Because of the overall higher thermal conductivity of the ambient gas around the ball less energy is therefore delivered to the end of the wire. A feature and advantage of the admixture of hydrogen is that the surface of the bonding ball is also thoroughly cleaned as any oxides of copper are reduced by the hydrogen. Furthermore, the hydrogen combines with any $O_2$ in the cover gas. A clean bonding ball results.

Figure 4C:
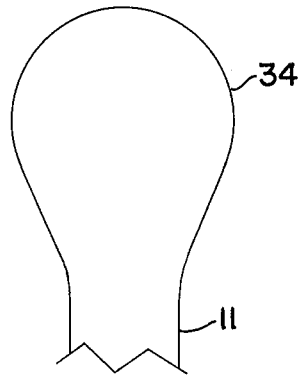
FIG. 4C is a plan view of a smaller oval shaped bonding ball formed in accordance with the method of the present invention using a higher percentage by volume of hydrogen e.g. 18%.
Figure 4D:
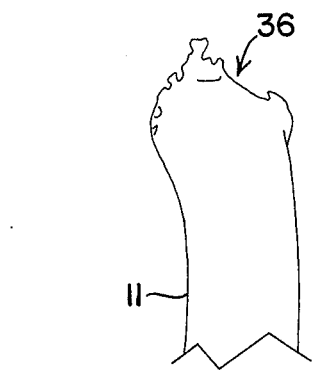
FIG. 4D is a plan view from the side of the end of a lead wire or bonding wire in which a bonding ball has failed to form according to the method of the present invention using the maximum limit of 25% by volume of hydrogen in the cover gas mixture.

With an increasing flow rate of hydrogen yielding 18% hydrogen by volume in the cover gas mixture, the smaller oblong or oval shaped bonding ball 34 illustrated in FIG. 4C results. At the limit of an even higher flow rate yielding 25% hydrogen by volume in the cover gas mixture ball formation is effectively attenuated. The high thermal conductivity of the cover gas mixture essentially deprives the end 36 of the bonding wire 11 of sufficient thermal energy to form a bonding ball at the electrical discharge energies used in the apparatus and method of U.S. Pat. No. 4,390,771. Thus, at the standard levels of electrical energy used for ball formation in stock ball bonding machines a percent by volume of hydrogen of 25% forms the outer limit for admixture of reactive hydrogen gas for the purposes of the present invention.

In the preferred range of 7% to 10% by volume of hydrogen, the method of the invention is also well within the safety factor which regards a gas mixture of 10% by volume or less of hydrogen to be nonflammable.

While the invention has been described with reference to particular example embodiments, it is intended to cover all modifications and equivalents within the scope of the following claims.

TABLE I

| ARGON | | HYDROGEN | | | |
|---|---|---|---|---|---|
| Indicated Rate On Flowmeter SCFH | Actual Rate SCFH | Indicated Rate On Flowmeter SCFH | Actual Rate SCFH | Percent Hydrogen By Volume | Ball Shape & Size |
| 0.4 | 0.34 | 0 | 0 | 0 | 3.0 mils Round |
| 0.4 | 0.34 | 0.01 | 0.038 | 10 | 2.5 mils Round |
| 0.4 | 0.34 | 0.02 | 0.076 | 18 | 2.0–2.4 mils Oblong |
| 0.4 | 0.34 | 0.03 | 0.114 | 25 | 0 No Ball |

We claim:

1. In a method for forming a ball at the end of lead wire held in a bonding tool of a ball bonding machine for ball bonding of the lead wire to a die pad an integrated circuit chip including the steps of substantially enclosing the end of the lead wire in a shield, flooding the shield and the end of the lead wire with a flow of inert cover gas, and electrically discharging an arc between the lead wire and the shield for melting and forming the ball at the end of the lead wire, the improvement comprising:

generating a flow of hydrogen gas separate from said inert cover gas;
   mixing the flow of hydrogen gas with the flow of inert cover gas at a location upstream from the shield a sufficient distance to permit substantially complete mixing of the hydrogen and inert cover gas upon reaching the shield;
   and controlling the percent by volume of hydrogen comprising the cover gas mixture to substantially eliminate oxidation during the ball forming process.

2. The method of claim 1 further comprising the step of controlling the percent by volume of hydrogen in the cover gas mixture over a range of greater than zero percent to less than 25% for controlling the size and shape of the ball formed at the end of the lead wire for ball bonding to a die pad of an integrated circuit chip.

3. The method of claim 1 further comprising the step of controlling the percent by volume of hydrogen comprising said cover gas mixture and varying said percentage by volume over a range from greater than zero percent to 18% for controlling the shape and size of the ball formed at the end of the bonding wire.

4. The method of claim 1 further comprising the step of controlling the percent by volume of hydrogen in the cover gas mixture in the preferred range of approximately 7% to 10% hydrogen gas.

5. The method of claim 1 wherein said inert cover gas is composed substantially of argon.

6. A method for forming a ball at the end of lead wire held in a bonding tool of a ball bonding machine for ball bonding of the lead wire to a die pad of an integrated circuit chip, and for controlling the size and shape of the ball at the end of the lead wire, including the steps of substantially enclosing the end of the lead wire in a shield, flooding the shield and the end of the lead wire with a flow of an inert cover gas, and electrically establishing an arc between the lead wire and shield for melting and forming a ball at the end of the lead wire, the improvement comprising:

generating a flow of reactive cover gas separate from the flow of inert cover gas, said reactive cover gas having a thermal conductivity substantially different from the thermal conductivity of the inert cover gas;

mixing the flow of reactive cover gas with the flow of inert cover gas at a location upstream from the shield a sufficient distance to provide substantially complete mixing of the reactive and inert cover gases for delivering a cover gas mixture at the shield;

and controlling the percent by volume of reactive cover gas comprising the cover gas mixture and therefore the effective thermal conductivity of the cover gas mixture for controlling the size and shape of the ball and for substantially eliminating oxidation during ball formation.

7. The method of claim 6 wherein the reactive cover gas comprises hydrogen.

8. The method of claim 7 wherein the step of controlling the percent by volume of reactive cover gas in the cover gas mixture comprises controlling the percent by volume of hydrogen in the cover gas mixture over a range of greater than 0% to less than 25% for controlling the size and shape of the ball formed at the end of the lead wire.

9. The method of claim 7 wherein the inert cover gas comprises argon.

10. The method of claim 6 wherein the reactive cover gas comprises hydrogen and wherein the step of controlling the percent by volume of reactive cover gas comprising the cover gas mixture comprises controlling the percent by volume of hydrogen in the cover gas mixture in a range from 0.5% to 18% for controlling the shape and size of the ball formed at the end of the lead wire.

11. The method of claim 10 comprising the step of limiting the percent by volume of hydrogen in the cover gas mixture to the preferred range of approximately 7% to 10%.

12. The method of claim 10 wherein the inert cover gas comprises argon.

13. Apparatus for forming a ball at the end of lead wire held in the bonding tool of a ball bonding machine for ball bonding of the lead wire to a die pad of an integrated circuit chip, and for controlling the size and shape of the ball formed at the end of the lead wire, said apparatus including a shield for substantially enclosing the end of the lead wire, inert cover gas delivering means for flooding the shield and the end of the lead wire with an inert cover gas, and electrical means for establishing an arc between the lead wire and the shield for melting and forming a ball at the end of the lead wire, the improvement comprising:

reactive cover gas delivery means coupled to the inert cover gas delivery means for delivering and mixing a reactive cover gas with said inert cover gas at a location upstream from the shield for delivering a cover gas mixture of reactive cover gas and inert cover gas at the shield;

reactive cover gas having a thermal conductivity substantially different from the inert cover gas, said reactive cover gas being delivered by the reactive cover gas delivery means;

and valve means for metering and controlling the percent by volume of reactive cover gas in said cover gas mixture for controlling the effective thermal conductivity of the cover gas mixture and thereby the size and shape of the ball formed at the end of the lead wire as well as substantially eliminating oxidation during ball formation.

14. The apparatus of claim 13 wherein the reactive cover gas comprises hydrogen cover gas.

15. The apparatus of claim 14 wherein the inert cover gas comprises argon.

16. The apparatus of claim 15 wherein said valve means is constructed and arranged for metering and controlling the percent by volume of hydrogen in the cover gas mixture in a range from 0.5% to 18%.

* * * * *